United States Patent
Hu (10) Patent No.: US 7,190,592 B2
(45) Date of Patent: Mar. 13, 2007

(54) INTEGRATED LIBRARY CORE FOR EMBEDDED PASSIVE COMPONENTS AND METHOD FOR FORMING ELECTRONIC DEVICE THEREON

(75) Inventor: Chu-Chin Hu, Hsin-Chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 192 days.

(21) Appl. No.: 10/600,742

(22) Filed: Jun. 20, 2003

(65) Prior Publication Data

US 2004/0150966 A1 Aug. 5, 2004

(30) Foreign Application Priority Data

Jan. 30, 2003 (TW) ............... 92102630 A (51) Int. Cl.
*H01K 1/18* (2006.01)

(52) U.S. Cl. .............. 361/763; 361/762; 361/764; 361/765; 174/262; 174/263; 174/265; 174/266

(58) Field of Classification Search ........ 361/762–765; 174/262–263, 265–266
See application file for complete search history.

(56) References Cited

U.S. PATENT DOCUMENTS

| | | | |
|---|---|---|---|
| 3,857,683 A | | 12/1974 | Castonguay |
| 5,243,320 A | | 9/1993 | Clouser et al. |
| 5,683,928 A | | 11/1997 | Wojnarowski et al. |
| 6,021,050 A | * | 2/2000 | Ehman et al. ............ 361/793 |
| 6,225,570 B1 | * | 5/2001 | Ishiyama et al. ......... 174/260 |
| 6,288,905 B1 | * | 9/2001 | Chung ...................... 361/771 |
| 6,356,455 B1 | * | 3/2002 | Carpenter ................. 361/793 |
| 6,717,071 B2 | * | 4/2004 | Chang et al. ............. 174/266 |
| 6,757,178 B2 | * | 6/2004 | Okabe et al. ............. 361/793 |
| 6,806,428 B1 | * | 10/2004 | Kimura et al. ............ 174/260 |
| 6,876,091 B2 | * | 4/2005 | Takeuchi et al. .......... 257/793 |
| 2002/0071256 A1 | * | 6/2002 | Figueroa et al. ........... 361/763 |
| 2002/0118523 A1 | * | 8/2002 | Okabe et al. ............. 361/793 |
| 2003/0000737 A1 | * | 1/2003 | Liu et al. .................. 174/256 |

* cited by examiner

*Primary Examiner*—Dean A. Reichard
*Assistant Examiner*—Hoa C. Nguyen
(74) *Attorney, Agent, or Firm*—Fulbright & Jaworski L.L.P.

(57) ABSTRACT

An integrated library core for embedded passive components and a method for forming an electronic device on the library core are provided. An insulating core layer is formed with a plurality of openings penetrating therethrough and with electrically conductive layers on upper and lower surfaces thereof. The openings of the core layer are filled with materials for forming passive components such as resistors and capacitors. This thereby provides an integrated library core on which the electrically conductive layers of the core layer can be desirably patterned to electrically interconnect the passive components, and this library core can be electrically connected to an electronic device such as substrate or printed circuit board to enhance performances of electrical characteristics for the electronic device.

10 Claims, 6 Drawing Sheets

INTEGRATED LIBRARY CORE FOR EMBEDDED PASSIVE COMPONENTS AND METHOD FOR FORMING ELECTRONIC DEVICE THEREON

FIELD OF THE INVENTION

The present invention relates to an integrated library core for embedded passive components and methods for forming an electronic device on the library core, and more particularly, to a library core having an insulating core layer embedded with a plurality of capacitive and resistive materials, and a fabrication method for connecting the library core for forming an electronic device.

BACKGROUND OF THE INVENTION

Owing to the progress of semiconductor packaging technology and improvements in performances of electrical characteristics for semiconductor chips, semiconductor devices are developed to higher integration. In exemplification of a BGA (ball grid array) semiconductor package, a plurality of array-arranged solder balls are mounted on a bottom surface of a substrate and used as input/output (I/O) connections for electrically connecting a semiconductor chip mounted on the substrate to an external device such as printed circuit board (PCB). Compared to a conventional lead-frame based semiconductor device, the BGA configuration provides more I/O connections on a unit area of a chip carrier such as substrate, thereby improving trace routability on the chip carrier and allowing more semiconductor chips to be incorporated in the package.

In accordance with high integration of the semiconductor device, more leads and circuits are required, which may increase the occurrence of noise. Generally, passive components such as resistors, capacitors and inductors are incorporated in the semiconductor device in order to eliminate the noise and achieve the requirements for electrical characteristics of the semiconductor device.

Figure 1:
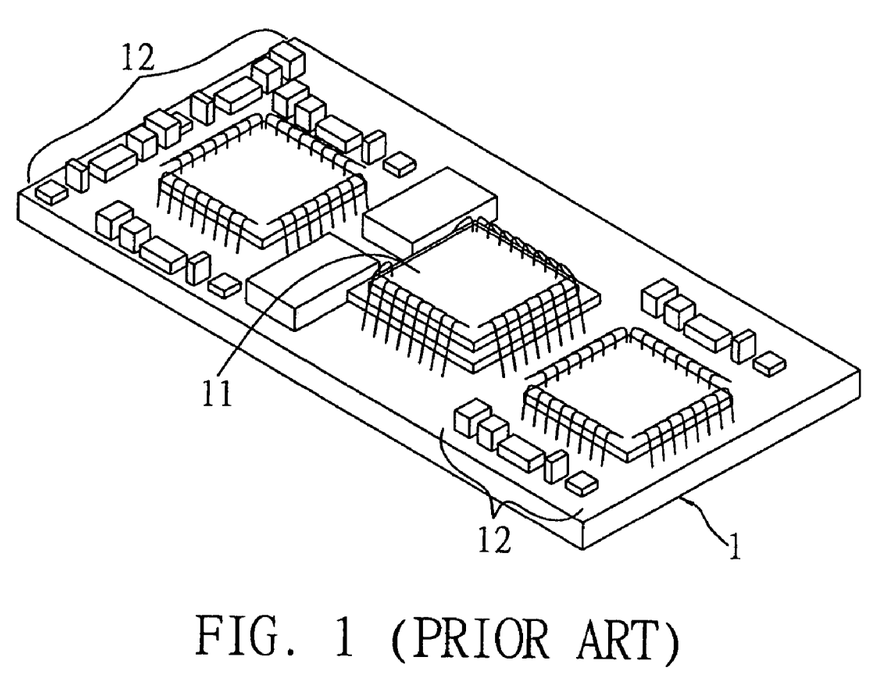
FIG. 1 (PRIOR ART) is a schematic diagram of a conventional circuit board with passive components mounted on area outside a chip attach region of the circuit board.

The passive components are normally mounted on the substrate at area unoccupied by mounting semiconductor chip. This thereby requires a relatively large substrate and undesirably enlarges overall dimensions of the semiconductor device; moreover, mounting the passive components respectively on the substrate also increases complexity of circuit arrangement and fabrication for the semiconductor device. As shown in FIG. 1, a plurality of passive components 12 are disposed on a surface of a substrate 1 that can be a printed circuit board or a packaging substrate for accommodating semiconductor chips. In order to prevent the passive components 12 from affecting electrical connection between a semiconductor chip 11 and a plurality of bond fingers formed on the substrate 1, conventionally, the passive components 12 are situated at corner positions on the substrate 1 or at area free of mounting the semiconductor chip 11; this thereby confines flexibility of trace routability on the substrate 1, making the number of passive components 12 undesirably limited. Therefore, if the above conventional arrangements were employed to incorporate more semiconductor chips 11 and passive components 12 on the substrate 1 necessarily to achieve enhanced performances of the semiconductor device, it would not only increase fabrication complexity but also significantly enlarge the dimensions of the semiconductor device, thereby not facilitating dimensions miniaturization of semiconductor packages.

Furthermore, in response to enhanced functionality and lower dimensions of electronic products, lamination technology needs to be improved for fabricating circuit boards with smaller thickness, a larger number of layers and higher density. Therefore, in order to make the circuit boards more compact in dimensions, multilayer circuit boards embedded with passive components are developed in which the passive components are mounted in the form of films in the multilayer circuit boards.

Figure 2A:
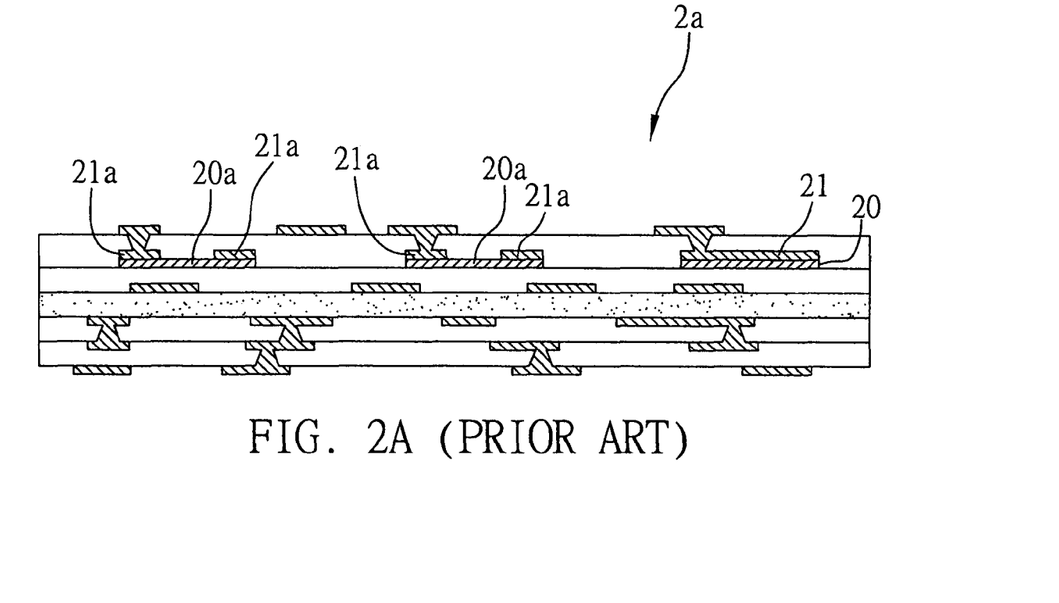
FIG. 2A (PRIOR ART) is a cross-sectional view of a conventional multi-layer circuit board embedded with a resistive film.
Figure 2B:
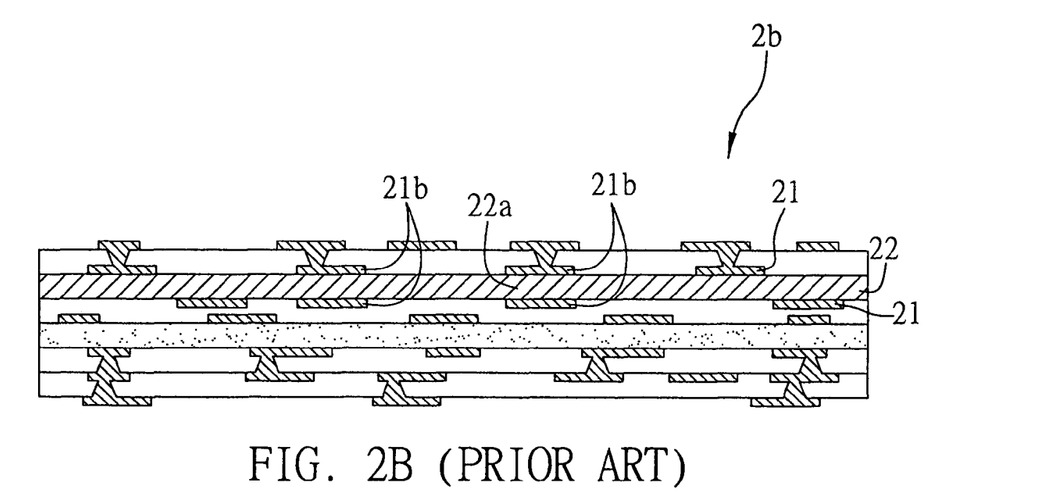
FIG. 2B (PRIOR ART) is a cross-sectional view of a conventional multi-layer circuit board embedded with a capacitive film.

The multi-layer circuit boards integrated with various films of passive components can have different configurations. As shown in FIG. 2A, a resistive film 20 is embedded in a multi-layer circuit board 2a and formed over an electrically conductive layer 21. The resistive film 20 is composed of thick film materials and thin film resistive materials, wherein the thick film materials include silver powders or carbon particles dispersed in a resin, and ruthenium oxide ($RuO_2$) and glass powders dispersed in a binder to be coated and cured, and the thin film materials include alloys such as nickel-chromium (Ni—Cr) alloy, nickel-phosphorus (Ni—P) alloy, nickel-tin (Ni—Sn) alloy, chromium-aluminum (Cr—Al) and titanium nitride (TaN) alloy to be applied by sputtering, electroplating or electroless plating technique. The resistive film 20 and electrically conductive layer 21 are patterned to form resistors 20a. The patterned electrically conductive layer 21 is partly used as resistor electrodes 21a to thereby accomplish a multi-layer circuit board with embedded resistors. Similarly, as shown in FIG. 2B, as to integrating and embedding a capacitive film 22 in a multi-layer circuit board 2b, a dielectric layer with a high dielectric constant is used as the capacitive film 22 made of for example, polymeric materials, ceramic materials, polymers formed by ceramic powders and the like, such as barium titanate, lead zirconate titanate, amorphous hydrogenated carbon, or powders thereof dispersed in a binder which can be shaped by printing or roller coating technique. Electrically conductive layers 21 formed over opposite surfaces of the capacitive film 22 are patterned and partly used as parallel sheets 21b for capacitors 22a so as to form a multi-layer circuit board with embedded capacitors.

Materials and method for forming passive components such as resistors and capacitors in a laminated circuit board are highly expected; the key point is how to incorporate and embed these passive components in the circuit board. Related prior art references include for example, U.S. Pat. Nos. 3,857,683, 5,243,320 and 5,683,928, to name just a few, most of which is to form passive components such as resistors on an organic insulating layer by means of a printing and/or photoresistetching technique before fabricating a new laminate for a multi-layer circuit board. However, due to surface roughness of the organic insulating layer beneath the passive components, it would be hard to achieve desirable electrical accuracy; or if the organic insulating layer is excessively smooth, adhesion between the passive components and the insulating layer is weakened, which may degrade reliability of the circuit board. Further, the above method of forming the passive components would undesirably increase fabrication costs and process complexity of the circuit board.

In addition, although the multi-layer circuit board with embedded films of passive components can solve the aforementioned problems of restriction on trace routability of the circuit board, it still renders a drawback of requiring complex fabrication processes. Besides, since the passive components reside between laminations of the circuit board, in compliance with different requirements for electrical characteristics such as resistance and capacitance, the multi-layer circuit board needs to be designed and laminated again, which would significantly increase fabrication costs and bring about difficulties in managing material stocks.

Therefore, the problem to be solved herein is to provide an integrated library core for embedded passive components, which can be used in a semiconductor device or electronic device to enhance performances of electrical characteristics without affecting trace routability and fabrication costs of the semiconductor device or electronic device.

SUMMARY OF THE INVENTION

An objective of the present invention is to provide an integrated library core for embedded passive components and a method for forming an electronic device on the library core, wherein a core layer of the library core is formed with a plurality of openings where passive components such as resistors and capacitors are formed, and the core layer is further formed with patterned conductive traces on surfaces thereof for electrically interconnecting the passive components.

Another objective of the invention is to provide an integrated library core for embedded passive components and a method for forming an electronic device on the library core, whereby the library core can be used in a semiconductor packaging substrate to increase the number of passive components mounted in a semiconductor device with the substrate and to improve flexibility of trace routability on the substrate so as to reduce usage area on the substrate and thickness of the semiconductor device, thereby facilitating dimensions compactness for the semiconductor device.

A further objective of the invention is to provide an integrated library core for embedded passive components and a method for forming an electronic device on the library core, whereby in response to the requirements of compact dimensions, multiple functions and high performances of electrical characteristics for the electronic device, the library core can provide a sufficient amount of passive components for an external electronic device such as semiconductor packaging substrate or printed circuit board to thereby enhance performances of electrical characteristics for the electronic device without affecting trace routability thereof.

In accordance with the foregoing and other objectives, the present invention proposes an integrated library core for embedded passive components, including: an insulating core layer having an upper surface and a lower surface opposed to the upper surface, and formed with a plurality of openings penetrating therethrough; a plurality of areas provided for embedded the passive components and defined by the openings of the insulating core layer filled with passive component materials therein; and electrically conductive layers formed over the upper and lower surfaces of the insulating core layer respectively.

The library core for embedded with passive components such as resistors and capacitors allows the electrically conductive layers on the core layer thereof to be patterned to form a plurality of conductive traces used for electrically interconnecting the resistors and capacitors. Moreover, the core is further formed with a plurality of conductive vias for electrically interconnecting the conductive traces on the upper and lower surfaces of the core layer, such that simple fabrication processes can accomplish electrical arrangement for passive components in the library core and the requirement of electrical performances.

The library core for embedded passive components, as being applied to a semiconductor packaging substrate, can be subject to a build-up or lamination technique to coat an insulating layer over the conductive traces formed on the core layer and to form at least one circuit layer on the insulating layer, wherein the circuit layer is electrically connected to the corresponding conductive traces by means of a plurality of blind vias formed through the insulating layer, so as to form a multi-layer circuit board. The multi-layer circuit board is applicable to a flip-chip semiconductor packaging substrate or a wire-bonding semiconductor packaging substrate to increase the number of passive components mounted in a semiconductor device with the substrate and to improve flexibility of trace routability on the substrate, thereby reducing usage area occupied by passive components on the substrate and thickness of the semiconductor device in favor of making the semiconductor device more compact in dimensions.

A method for forming an electronic device on the library core for embedded passive components includes the following steps. The first step is to prepare an insulating core layer having an upper surface and a lower surface opposed to the upper surface, wherein the core layer is formed with a plurality of openings penetrating therethrough, allowing the openings to be filled with passive component materials, and electrically conductive layers are formed over the upper and lower surfaces of the core layer respectively. Then, the electrically conductive layers on the upper and lower surfaces of the core layer are patterned to form a plurality of conductive traces for electrically interconnecting the passive components, to thereby form the library core with the embedded passive components. Finally, the library core could be mounted and electrically connected to the electronic device such as semiconductor packaging substrate or printed circuit board.

Therefore, the library core for embedded passive components according to the invention can be used to provide desirable electrical functions for an electronic device such as semiconductor packaging substrate or printed circuit board. The electrically conductive layers on the core layer are patterned to form predetermined conductive traces prior to applying the library core to the semiconductor packaging substrate or printed circuit board; this can prevent the use of complex fabrication processes for mounting or embedding passive components in a conventional multi-layer circuit board, and reduce fabrication costs significantly for the multi-layer circuit board as not having to design or laminate the multi-layer circuit board again, in response to different requirements for electrical characteristics such as resistance and capacitance. Moreover, the library core for embedded passive components, as being adopted in the semiconductor packaging substrate, can increase the number of passive components mounted in a semiconductor device with the substrate and improve flexibility of trace routability on the substrate so as to reduce usage area occupied by passive components on the substrate and thickness of the semiconductor device, thereby facilitating dimensions compactness for the semiconductor device. Further, achieving the requirements of compact dimensions, multiple functions and high performances of electrical characteristics for the electronic device, the library core according to the invention can provide a sufficient amount of passive components for an external electronic device such as printed circuit board to thereby enhance performances of electrical characteristics for the electronic device without affecting trace routability thereof.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 3A:
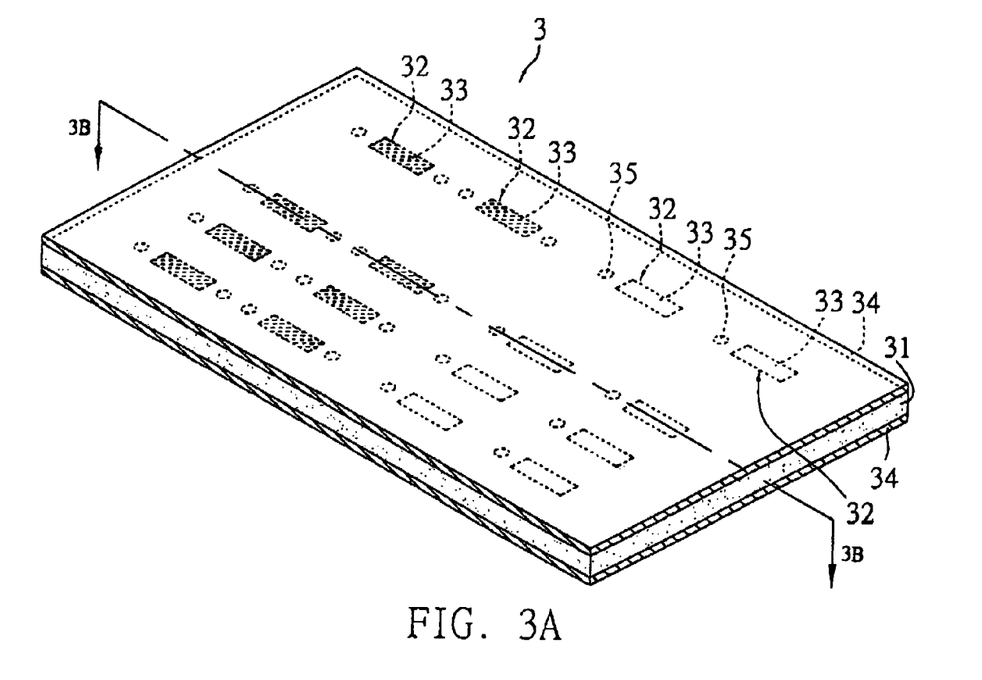
FIG. 3A is a schematic diagram of a library core for embedded passive components according to the invention.
Figure 3B:
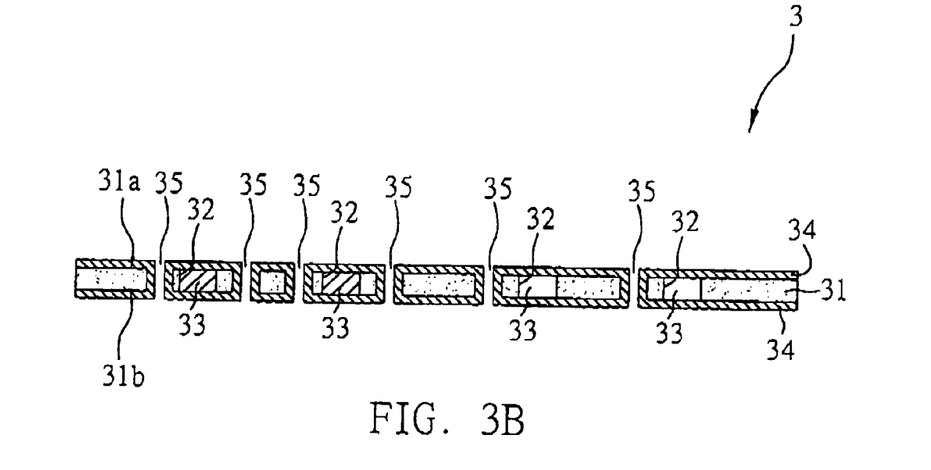
FIG. 3B is a cross-sectional view of the library core for embedded passive components according to the invention.

FIGS. 3A and 3B illustrate an integrated library core for embedded passive components proposed in the present invention.

As shown in the drawings, this library core 3 primarily includes: an insulating core layer 31 having an upper surface 31a and a lower surface 31b opposed to the upper surface 31a, and formed with a plurality of openings 32 penetrating through the core layer 31; a plurality of areas 33 provided for embedded passive components and defined by the openings 32 of the insulating core layer 31 filled with passive component materials therein; and electrically conductive layers 34 formed over the upper and lower surfaces 31a, 31b of the core layer 31 respectively, wherein the electrically conductive layers 34 cover the areas 33 for forming the passive components contained within the openings 32 of the core layer 31. The library core 3 is further formed with a plurality of conductive vias 35 for electrically interconnecting the electrically conductive layers 34 respective on the upper and lower surfaces 31a, 31b of the core layer 31.

The insulating core layer 31 is made of an insulating organic or ceramic material such as epoxy resin, polyimide, BT (bismaleimide triazine) resin, a complex material of glass fiber, etc; or the insulating core layer 31 can be laminated from a plurality of layers of different insulating materials. The insulating core layer 31 has an upper surface 31a and a lower surface 31b opposed to the upper surface 31a, and is formed with a plurality of openings 32 penetrating through the same. These openings 32 are flexibly dimensioned and shaped, and used as the areas 33 filled with passive component materials therein for embedded passive components. And, each of the upper and lower surfaces 31a, 31b of the core layer 31 are covered with electrically conductive layers 34 such as copper and the like.

The areas 33 within passive component materials can be those used for forming resistors and capacitors. The passive component materials for resistors include silver powders or carbon particles dispersed in a resin, ruthenium oxide ($RuO_2$) and glass powders dispersed in a binder, or alloys such as nickel-chromium (Ni—Cr) alloy, nickel-phosphorus (Ni—P) alloy, nickel-tin (Ni—Sn) alloy, chromium-aluminum (Cr—Al) and titanium nitride (TaN) alloy, etc. After the areas 33 for resistors are filled passive component materials into the openings 32 of the core layer 31, electrically conductive layers 34 on the core layer 31 are patterned to form resistor electrodes 34b for electrically interconnecting the areas 33, to thereby fabricate the resistors 33a, as shown in FIG. 4A.

The passive component materials for capacitors are those having high dielectric constants, including polymeric materials, ceramic materials, polymers formed by ceramic powders and the like, such as barium titanate, lead zirconate titanate, amorphous hydrogenated carbon, or powders thereof dispersed in a binder. After the areas 33 for capacitors are filled passive component materials into the openings 32 of the core layer 31, the electrically conductive layers 34 on the core layer 31 are patterned to form parallel sheets 34c covering the materials, to thereby fabricate the capacitors 33b, as shown in FIG. 4A.

Moreover, the library core 3 is formed with a plurality of conductive vias 35 for electrically interconnecting the patterned electrically conductive layers respective on the upper and lower surfaces 31a, 31b of the core layer 31, and the patterned electrically conductive layers allow the areas 33 such as resistors and capacitors formed therein to be electrically interconnected in order to comply with electrical functions of an electronic device for use with the library core 3.

Figure 4A:
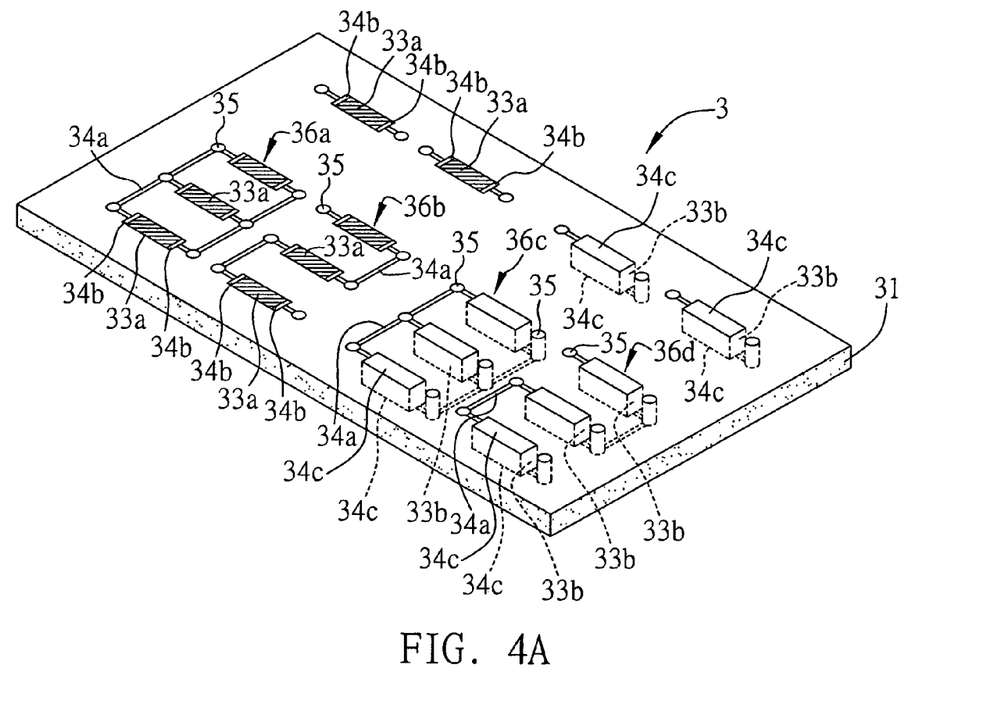
FIG. 4A is a schematic diagram of the library core formed with patterned conductive traces according to the invention.
Figure 4B:
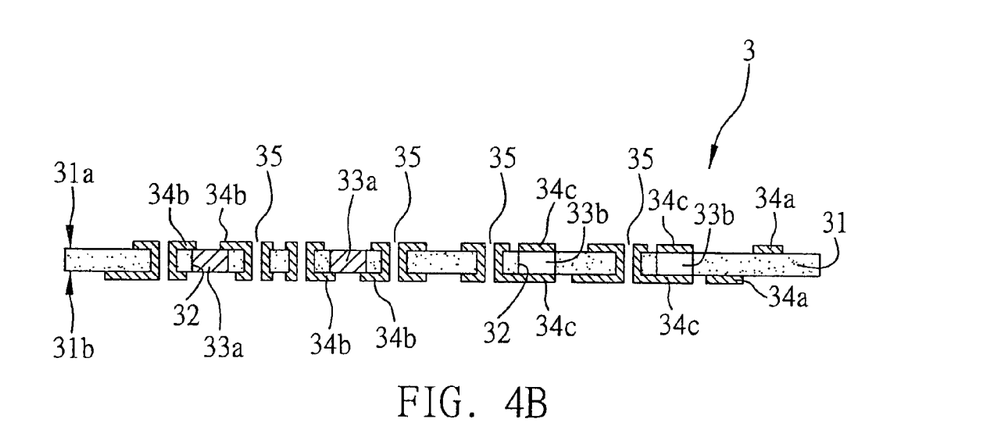
FIG. 4B is a cross-sectional view of the library core formed with patterned conductive traces according to the invention.

FIGS. 4A and 4B illustrate the library core 3 formed with patterned conductive traces according to the invention. As shown in the drawings, the electrically conductive layers 34 on the upper and lower surfaces 31a, 31b of the core layer 31 are subject to lithography and etching techniques to be patterned and form a plurality of conductive traces 34a that are partly used as resistor electrodes 34b for resistors 33a and parallel sheets 34c for capacitors 33b. By the patterned conductive traces 34a, resistor electrodes 34b of resistors 33a and parallel sheets 34c of capacitors 33b, the materials for passive components embedded in the insulating core layer 31 can be adapted to be formed with parallel and/or series electrical connection between the resistors 33a and/or capacitors 33b; and, resistance of the resistors 33a and capacitance of the capacitors 33b can be determined upon types and quantities of the materials for the resistors 33a and capacitors 33b filled into the openings 32 of the core layer 31. As shown in FIG. 4A, the reference numeral 36a represents resistance integrated from three resistors 33a connected in parallel, the reference numeral 36b represents resistance integrated from three resistors 33a connected in series, the reference numeral 36c represents capacitance integrated from three capacitors 33b connected in parallel, and the reference numeral 36d represents capacitance integrated from three capacitors 33b connected in series.

After forming the patterned conductive traces, the library core for embedded passive components can be used in an external device such as semiconductor packaging substrate or printed circuit board to enhance performances of electrical characteristics for the external device.

Figure 5:
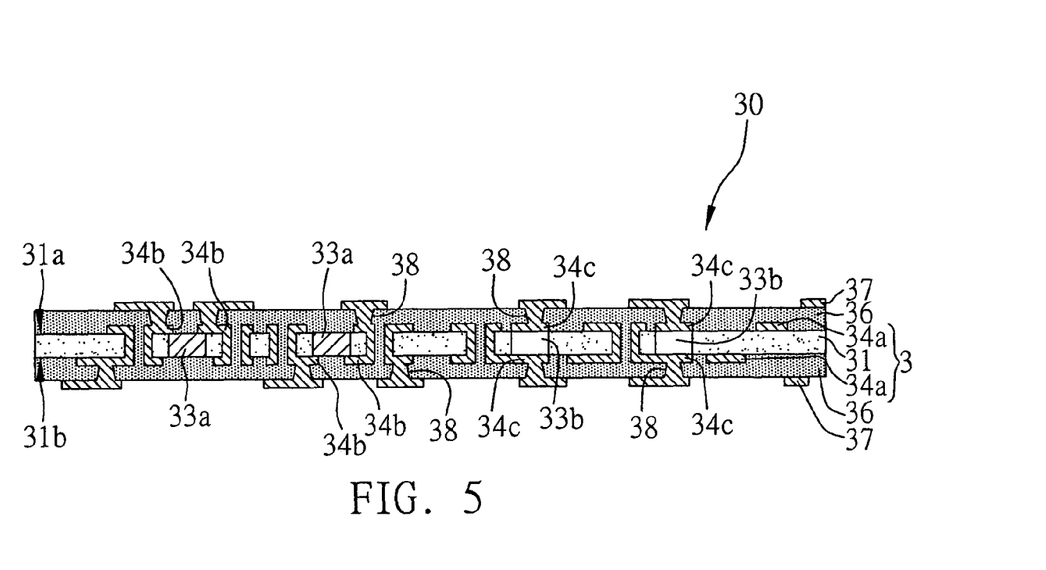
FIG. 5 is a cross-sectional view of the library core used in a semiconductor packaging substrate according to the invention.

Referring to FIG. 5, the library core 3 with patterned conductive traces 34a, as being applied to a semiconductor packaging substrate, is subject to a build-up or lamination technique to coat an insulating layer 36 over the conductive traces 34a on the upper or lower surface 31a, 31b of the core layer 31 and to form at least one circuit layer 37 on the insulating layer 36, wherein the circuit layer 37 is electrically connected to the corresponding conductive traces 34a by means of a plurality of blind vias 38 formed through the insulating layer 36, so as to form a multi-layer circuit board 30. The circuit layer 37 on the insulating layer 36 can be a patterned copper layer or plated conductive traces, and the insulating layer 36 can be made of an electrically insulating material such as organic material, fiber-enhanced organic material, filler-enhanced organic material, etc. The multi-layer circuit board 30 is applicable to a flip-chip semiconductor packaging substrate or a wire-bonding semiconductor packaging substrate so as to increase the number of passive components mounted in a semiconductor device with the substrate and to improve flexibility of trace routability on the substrate, thereby reducing usage area occupied by passive components on the substrate and thickness of the semiconductor device in favor of making the semiconductor device more compact in dimensions.

Figure 6A:
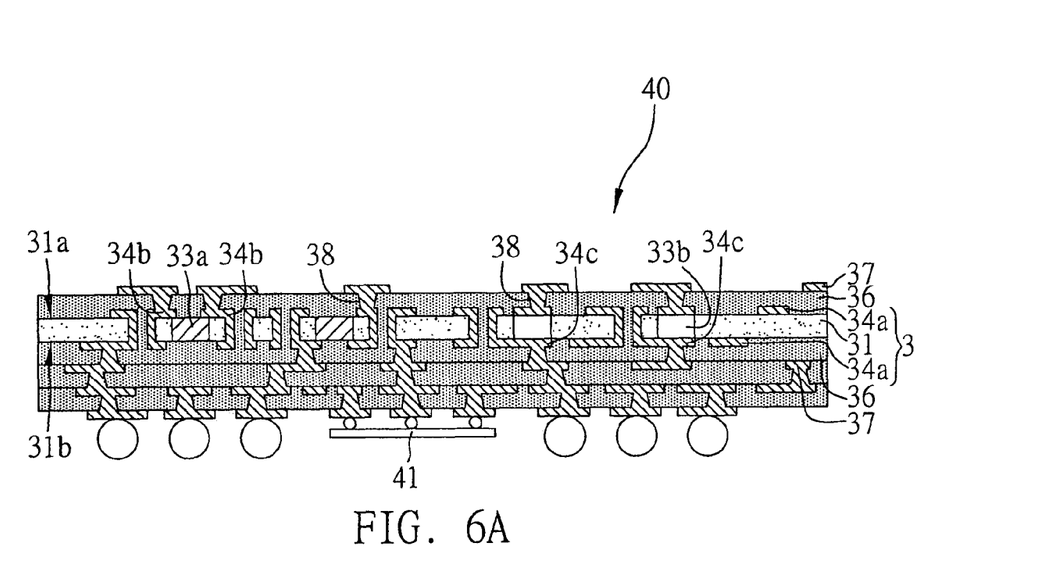
FIGS. 6A and 6B are cross-sectional views of the library core used in an electronic device according to the invention.
Figure 6B:
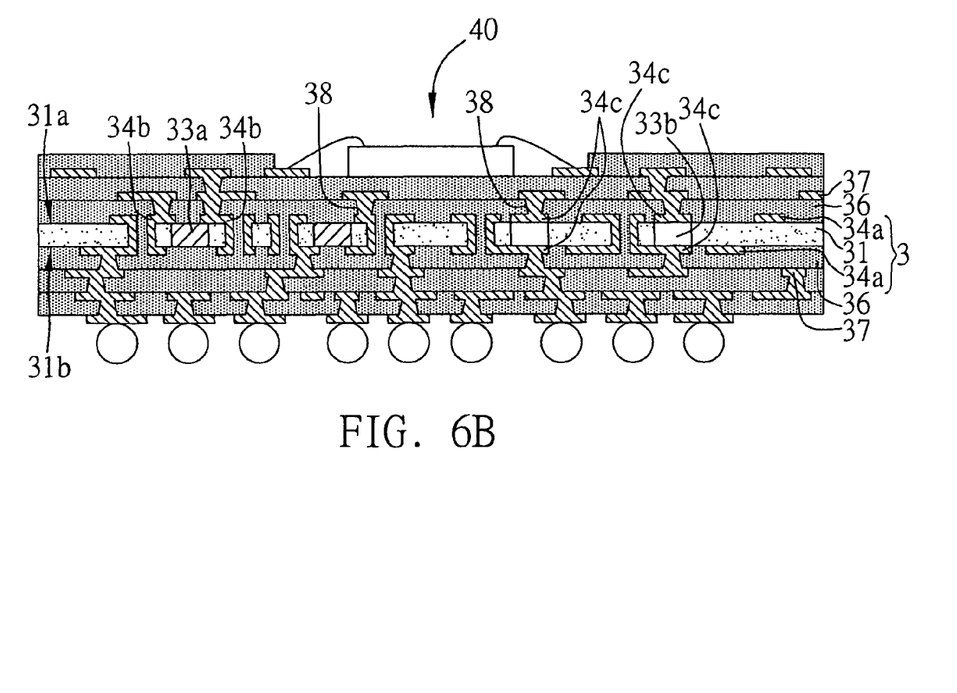
Figure 6C:
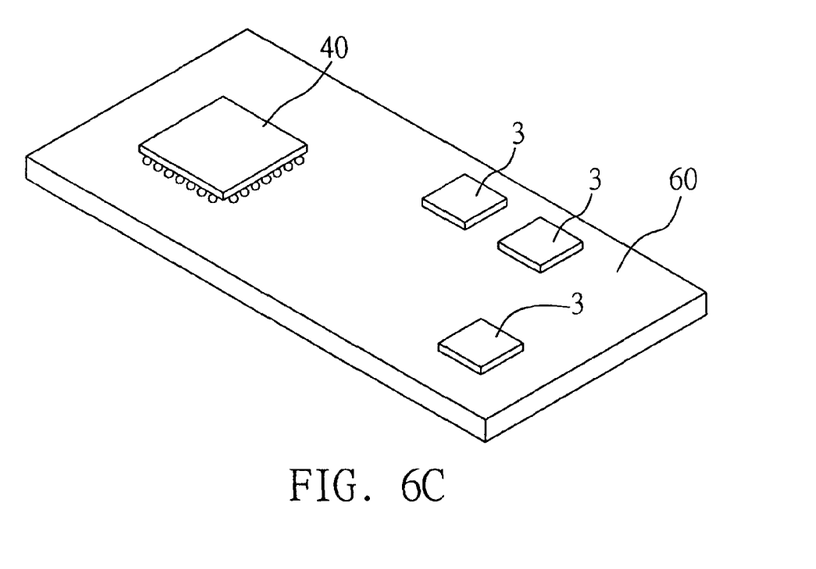
FIG. 6C is a schematic diagram of the library core used in a printed circuit board according to the invention.

Referring to FIG. 6A, in response to requirements of compact dimensions, multiple functions and high performances of electrical characteristics for an electronic device, the library core 3 with embedded passive components can be mounted to one side of a flip-chip semiconductor packaging substrate 40, and on the other side of the substrate 40 there is mounted and electrically connected at least one flip-chip semiconductor chip 41, whereby the library core 3 formed with patterned conductive traces can provide a sufficient number of resistors 33a and capacitors 33b with predetermined electrical functions for the substrate 40. It should be understood that the library core 3 according to the invention could also be used and embedded in a wire-bonding semiconductor packaging substrate 40, as shown in FIG. 6B. Referring to FIG. 6C, the multi-layer circuit board 30 shown in FIG. 5 is embedded with the library core 3 and also used in an external electronic device such as printed circuit board 60 to provide a sufficient number of resistors 33a and capacitors 33b for the printed circuit board 60, thereby enhancing performances of electrical characteristics for the electronic device without affecting trace routability thereof.

A method for forming an electronic device on the library core 3 with embedded passive components includes the following steps. First, an insulating core layer 31 having an upper surface 31a and an opposing lower surface 31b is prepared and formed with a plurality of openings 32 penetrating therethrough, the openings 32 being flexibly dimensioned and shaped. Then, the openings 32 of the core layer 31 are filled with materials for forming passive components such as resistors and capacitors, and an electrically conductive layer 34 is formed over the upper and lower surfaces 31a, 31b of the core layer 31 respectively.

Thereafter, the electrically conductive layers 34 respective on the upper and lower surfaces 31a, 31b of the core layer 31 are subject to lithography and etching techniques and patterned to form a plurality of conductive traces 34a which can be partly used as resistor electrodes 34b for resistors 33a and parallel sheets 34c for capacitors 33b, whereby the resistors 33a and capacitors 33b can be electrically interconnected and integrated by the conductive traces 34a.

Finally, the patterned library core 3 with embedded passive components is used as a core for a multi-layer circuit board that can be mounted and electrically connected to an electronic device such as semiconductor packaging substrate 40 or printed circuit board 60.

Therefore, the library core for embedded passive components according to the invention can be used to provide desirable electrical functions for an electronic device such as semiconductor packaging substrate or printed circuit board. The electrically conductive layers on the core layer of the library core are patterned to form predetermined conductive traces prior to applying the library core to the semiconductor packaging substrate or printed circuit board; this can prevent the use of complex fabrication processes for mounting or embedding passive components in a conventional multi-layer circuit board, and eliminate significant increase in fabrication costs for the multi-layer circuit board as not having to design or laminate the multi-layer circuit board again , in response to different requirements for electrical characteristics such as resistance and capacitance. Moreover, the library core for embedded passive components, as being adopted in the semiconductor packaging substrate, can increase the number of passive components mounted in a semiconductor device with the substrate and improve flexibility of trace routability on the substrate so as to reduce usage area occupied by passive components on the substrate and thickness of the semiconductor device, thereby facilitating dimensions compactness for the semiconductor device. Further, in response to the requirements of compact dimensions, multiple functions and high performances of electrical characteristics for the electronic device, the library core according to the invention can provide a sufficient amount of passive components for an external electronic device such as printed circuit board to thereby enhance performances of electrical characteristics for the electronic device without affecting trace routability thereof.

The invention has been described using exemplary preferred embodiments. However, it is to be understood that the scope of the invention is not limited to the disclosed embodiments. On the contrary, it is intended to cover various modifications and similar arrangements; for example, the number and locations of resistors and capacitors can be flexibly arranged according to practical requirements. The scope of the claims, therefore, should be accorded the broadest interpretation so as to encompass all such modifications and similar arrangements.

What is claimed is:

1. A library core for embedded passive components, comprising:
   an insulating core layer having an upper surface and a lower surface opposed to the upper surface, and formed with a plurality of openings penetrating therethrough, wherein the openings are filled with capacitive materials therein; and
   a plurality of conductive traces formed from electrically conductive layers as a whole on the core layer by patterning, and formed over the upper and lower surfaces of the core layer and fully covered the capacitive materials, wherein the conductive traces are electrically interconnected to the capacitive materials as well as partly used as parallel sheets onto the capacitive materials to form capacitors embedded in the core layer.

2. The library core for embedded passive components of claim 1, wherein the core layer is formed with a plurality of conductive vias for electrically interconnecting the electrically conductive layers on the upper and lower surfaces of the core layer.

3. The library core for embedded passive components of claim 1, wherein the library core with the patterned conductive traces is fabricated in a semiconductor packaging substrate or printed circuit board for enhancing performances of electrical characteristics.

4. The library core for embedded passive components of claim 1, wherein the library core with the patterned conductive traces is formed with an insulating layer over the conductive traces on the core layer and formed at least one circuit layer on the insulating layer so as to form a multi-layer circuit board.

5. The library core for embedded passive components of claim 4, wherein the multi-layer circuit board is fabricated in a flip-chip semiconductor packaging substrate.

6. The library core for embedded passive components of claim 4, wherein the multi-layer circuit board is fabricated in a wire-bonding semiconductor packaging substrate.

7. The library core for embedded passive components of claim 1, wherein the capacitive materials is polymeric materials, ceramic materials, or polymers formed by ceramic powders.

8. A method for forming a library core for embedded passive components, comprising the steps of:

providing an insulating core layer having an upper surface and a lower surface opposed to the upper surface, wherein the core layer is formed with a plurality of openings penetrating therethrough, allowing the openings to be filled with capacitive materials, and electrically conductive layers formed as a whole on the core layer are over the upper and lower surfaces of the core layer respectively; and patterning the electrically conductive layers respective on the upper and lower surfaces of the core layer to form a plurality of conductive traces for electrically interconnecting the capacitive materials contained in the openings of the core layer as well as partly used as parallel sheets onto the capacitive materials to thereby form the library core with the embedded capacitor.

9. The method of claim 8, wherein the core layer is formed with a plurality of conductive vias for electrically interconnecting the conductive traces on the upper and lower surfaces of the core layer.

10. The method of claim 8, wherein the capacitive materials is polymeric materials, ceramic materials, or polymers formed by ceramic powders.

* * * * *